(12) United States Patent
Sakaba et al.

(10) Patent No.: US 8,305,150 B2
(45) Date of Patent: Nov. 6, 2012

(54) SURFACE MOUNT CRYSTAL OSCILLATOR AND MANUFACTURING METHOD OF THE SAME

(75) Inventors: Yasuo Sakaba, Sayama (JP); Masashi Sato, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/929,096

(22) Filed: Dec. 30, 2010

(65) Prior Publication Data
US 2011/0221535 A1    Sep. 15, 2011

(30) Foreign Application Priority Data

Mar. 9, 2010   (JP) ............... P.2010-051597
Oct. 15, 2010  (JP) ............... P.2010-232505

(51) Int. Cl.
    *H03H 9/02*   (2006.01)
(52) U.S. Cl. ......................... 331/68; 310/348
(58) Field of Classification Search ............ 331/68, 331/158; 310/348
    See application file for complete search history.

(56) References Cited

U.S. PATENT DOCUMENTS

| | | | |
|---|---|---|---|
| 7,095,161 B2* | 8/2006 | Unno et al. | 310/348 |
| 7,256,658 B2* | 8/2007 | Asamura | 331/68 |
| 7,482,735 B2* | 1/2009 | Harada et al. | 310/348 |
| 2002/0033652 A1* | 3/2002 | Serizawa | 310/348 |

FOREIGN PATENT DOCUMENTS

| | | |
|---|---|---|
| JP | 2000-294899 | 10/2000 |
| JP | 2001-110925 | 4/2001 |
| JP | 2003-179456 | 6/2003 |
| JP | 2004-166006 | 6/2004 |
| JP | 2005-198237 | 7/2005 |
| JP | 2006-033413 | 2/2006 |
| JP | 2006-238115 | 9/2006 |
| JP | 2007-158419 | 6/2007 |
| JP | 2009-100353 | 5/2009 |

* cited by examiner

*Primary Examiner* — Joseph Chang
(74) *Attorney, Agent, or Firm* — Jacobson Holman PLLC (57) ABSTRACT

There are disclosed a surface mount crystal oscillator which can enhance a product quality and improve productivity while realizing miniaturization and a manufacturing method of the crystal oscillator. On wall faces of through holes formed in corner portions of a rectangular ceramic base, through terminals are formed; on the front surface of the ceramic base, leading terminals of crystal holding terminals which hold a crystal piece are connected to the diagonal through terminals; on the back surface of the ceramic base, mount terminals connected to the through terminals are formed; and an insulating film projected especially in a corner portion direction is formed at such a position as to face the opening end face of a metal cover.

18 Claims, 9 Drawing Sheets

SURFACE MOUNT CRYSTAL OSCILLATOR AND MANUFACTURING METHOD OF THE SAME

This application has a priority of Japanese no. 2010-051597 filed Mar. 9, 2010, and no. 2010-232505 filed Oct. 15, 2010 hereby incorporated by reference.

BACKGROUND OF THE INVENTION

1. Field of the Invention

The present invention relates to a crystal oscillator for surface mount, and more particularly, it relates to a surface mount crystal oscillator which can improve productivity and realize miniaturization and a manufacturing method of the same.

2. Description of the Related Art

[Prior Art]

A surface mount crystal oscillator is small-sized and lightweight, and is hence incorporated as a. frequency or time reference source in a portable type electronic device.

In a conventional surface mount crystal oscillator, a crystal piece 2 is mounted on a ceramic substrate, and is covered and sealed with an inverted cover having a recessed shape. In recent years, there has been suggested an inexpensive household oscillator having a frequency deviation Δf/f which is comparatively loosely regulated, for example, from ±150 to ±250 ppm.

[Related Art]

It is to be noted that examples of a related art include Japanese Patent Application Laid-Open No. 2007-158419 'Surface Mount Crystal Oscillator' (Nihon Dempa Kogyo Co., Ltd.) [Patent Document 1], Japanese Patent Application Laid-Open No. 2003-179456 'Surface Mount Container for Crystal Product and Crystal Product using the Same' (Nihon Dempa Kogyo Co., Ltd.) [Patent Document 2], and Japanese Patent Application Laid-Open No. 2001-110925 'Conductive Cap, Electronic Component, and Method of forming Insulating Film on Conductive Cap' (Murata Mfg. Co., Ltd.) [Patent Document 3].

Patent Document 1 discloses a constitution of a surface mount crystal oscillator in which a crystal piece 3 is mounted on an IC chip 2, the IC chip 2 and the like are formed on a mount substrate 4, and a metal cover 5 is disposed.

Moreover, Patent Document 2 discloses a constitution of a surface mount container for a crystal product in which a crystal piece 3 is disposed on a single layer substrate 1A via a crystal terminal 6, and is sealed with a cover 2.

Furthermore, Patent Document 3 discloses, in paragraph [0005] of Prior Art, a constitution in which on a substrate 51, a rectangular frame-like insulating film 55 is formed on a portion where the lower opening end face of a metal cap 52 comes in contact with an upper surface 51a of the substrate 51.

SUMMARY OF THE INVENTION

However, in the above conventional surface mount crystal oscillator, in recent years, an increasingly miniaturized constitution obtained by mounting a crystal piece on a substrate and further sealing the piece with a cover has a problem that it is difficult to decrease a defect ratio, improve productivity and enhance a product quality.

Specifically, when the crystal piece and the cover are miniaturized, the constitution needs to be contrived so that crystal holding terminals connected to the crystal piece by a conductive adhesive to hold the crystal oscillator and leading terminals led from the crystal holding terminals to electrodes do not electrically cause short circuit, and the conventional constitution cannot sufficiently realize miniaturization.

The present invention has been developed in view of the above situation, and an object thereof is to provide a surface mount crystal oscillator which can enhance a product quality and improve productivity while realizing miniaturization and a manufacturing method of the same.

To solve the problems of the above conventional examples, the present invention provides a surface mount crystal oscillator comprising a crystal piece held by first and second crystal holding terminals on a rectangular ceramic substrate, wherein on wall faces of through holes formed in corner portions of the substrate, through terminals are formed, on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, on the back surface of the substrate, mount terminals connected to the through terminals are formed, on the outer peripheral front surface of the substrate, an insulating film is formed at such a position as to face the opening end face of a cover, and the insulating film projects from the opening end face in the corner portions of the substrate, which produces an effect that while realizing miniaturization, short circuit can be prevented to enhance a product quality, thereby improving productivity.

According to the present invention, in the above surface mount crystal oscillator, the insulating film is formed so as to cover the first leading terminal and the second leading terminal and also cover the outside of the through terminals in the corner portions of the substrate.

According to the present invention, in the above surface mount crystal oscillator, one leading electrode and the other leading electrode of the crystal piece are led in opposite directions, and the first crystal holding terminal and the second crystal holding terminal constitute such a both-ends holding type as to hold both ends of the crystal piece.

According to the present invention, in the above surface mount crystal oscillator, the first crystal holding terminal is connected to the one leading electrode of the crystal piece by a conductive adhesive in an end portion from which the first leading terminal is led, and the second crystal holding terminal is connected to the other leading electrode of the crystal piece by the conductive adhesive in an end portion from which the second leading terminal is led.

According to the present invention, in the above surface mount crystal oscillator, the end portion of the first crystal holding terminal on a side on which any conductive adhesive is not disposed is formed to be short inwardly from the end portion of the one leading electrode, and the end portion of the second crystal holding terminal on a side on which any conductive adhesive is not disposed is formed to be short inwardly from the end portion of the other leading electrode.

According to the present invention, in the above surface mount crystal oscillator, the one leading electrode and the other leading electrode of the crystal piece are led in the same direction, and the first crystal holding terminal and the second crystal holding terminal constitute such a cantilever type as to hold one end of the crystal piece.

According to the present invention, in the above surface mount crystal oscillator, the first crystal holding terminal is connected to the one leading electrode led to one side of the crystal piece by a conductive adhesive in an end portion from which the first leading terminal is led, the second crystal holding terminal is connected to the other leading electrode led to the one side of the crystal piece by the conductive adhesive in the one side of the crystal piece from which the other leading electrode is led, and the second leading terminal passes under the crystal piece from a position of the second crystal holding terminal connected by the conductive adhesive and is connected to the through terminal of the corner portion in the direction reverse to the direction in which the first leading terminal is led.

The present invention provides a manufacturing method of a surface mount crystal oscillator comprising a crystal piece held by first and second crystal holding terminals on a rectangular ceramic substrate, comprising: a step of forming, in a sheet-like ceramic material, break lines which specify individual ceramic substrate regions and through holes which correspond to corner portions of the regions and firing the ceramic material to form a sheet-like ceramic base; a step of forming metal layers of through terminals on wall faces of the through holes, forming, on the front surface of the ceramic base, a pattern of a metal layer in which the first crystal holding terminal and a first leading terminal led from the terminal are connected to the through terminal of the shortest corner portion, and a second leading terminal led from the second crystal holding terminal is connected to the through terminal of the corner portion in a direction reverse to a direction in which the first leading terminal is led, and forming, on the back surface of the ceramic base, a pattern of a metal layer of mount terminals connected to the through terminals; a step of forming an insulating film at such a position as to face the opening end face of a cover on the outer peripheral front surface of the substrate so that the insulating film projects from the opening end face in the corner portions of the substrate; a step of mounting the crystal piece on the first and second crystal holding terminals; and a step of regulating a vibration frequency by use of the mount terminal connected to the first crystal holding terminal and the mount terminal connected to the second crystal holding terminal.

According to the present invention, in the above manufacturing method of the surface mount crystal oscillator, the step of forming the insulating film forms the insulating film so as to cover the first leading terminal and the second leading terminal and also cover the outside of the through terminals in the corner portions of the substrate.

According to the present invention, in the above manufacturing method of the surface mount crystal oscillator, an excitation electrode on the front surface of the crystal piece is irradiated with gas ions to cut the front surface from the excitation electrode, and a mass of the excitation electrode is decreased to regulate the vibration frequency from a low frequency to a high frequency.

Furthermore, according to the present invention, in the above manufacturing method of the surface mount crystal oscillator, a metal film is applied onto the excitation electrode to regulate the vibration frequency from a high frequency to a low frequency.

DESCRIPTION OF REFERENCE NUMERALS

1 . . . ceramic base (substrate), 1A . . . sheet-like ceramic base, 2 . . . crystal piece, 3 . . . metal cover (cover), 3a . . . flange, 4 . . . crystal holding terminal, 4a and 4b . . . leading terminal, 5a and 5b . . . mount terminal, 5x . . . through terminal, 6a . . . excitation electrode, 6b . . . leading electrode, 7 . . . conductive adhesive, 8 . . . seal material, 9 . . . through hole, and 10 . . . insulating film.

DESCRIPTION OF PREFERRED EMBODIMENT

Figure 1:
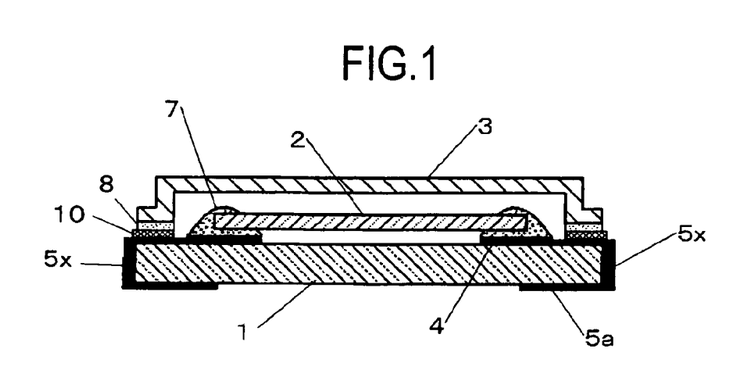
FIG. 1 is an explanatory sectional view of a surface mount crystal oscillator according to an embodiment of the present invention.

An embodiment of the present invention will be described with reference to the drawings.
[Summary of Embodiment]
In a surface mount crystal oscillator according to an embodiment of the present invention, on wall faces of through holes formed in corner portions of a rectangular ceramic substrate, through terminals are formed. On the front surface of the substrate, leading terminals of crystal holding terminals which hold a crystal piece are connected to the diagonal through terminals. Moreover, on the back surface of the substrate, mount terminals connected to the through terminals are formed. An insulating film projected especially toward the corner portions is formed at such a position as to face the opening end face of a metal cover. While realizing miniaturization, short circuit is prevented to enhance a product quality, thereby improving productivity.
[Constitution of Surface Mount Crystal Oscillator: FIG. 1]
The surface mount crystal oscillator according to the embodiment of the present invention will be described with reference to FIG. 1. FIG. 1 is an explanatory sectional view of the surface mount crystal oscillator according to the embodiment of the present invention.

In the surface mount crystal oscillator according to the embodiment of the present invention (the present oscillator), as shown in FIG. 1, a crystal piece 2 is mounted on crystal holding terminals 4 formed on a ceramic base (a substrate) 1 via a conductive adhesive 7. Furthermore, a recessed metal cover (a cover) 3 is inverted and joined, via an insulating film 10, onto the ceramic base 1 which is sealed.

Moreover, a through terminal (a side wall terminal) 5*x* is formed on the side surface of the substrate 1, connected to a leading terminal 4*a* led from the crystal holding terminal 4 formed on the front surface of the substrate 1, and connected to a mount terminal 5*a* formed on the back surface of the substrate 1.

The through terminals 5*x* are formed on side walls of through holes 9 formed in four corners of the substrate 1.

Furthermore, a seal material 8 having insulation properties is formed in a contact portion between the substrate 1 and the cover 3.

Figure 2:
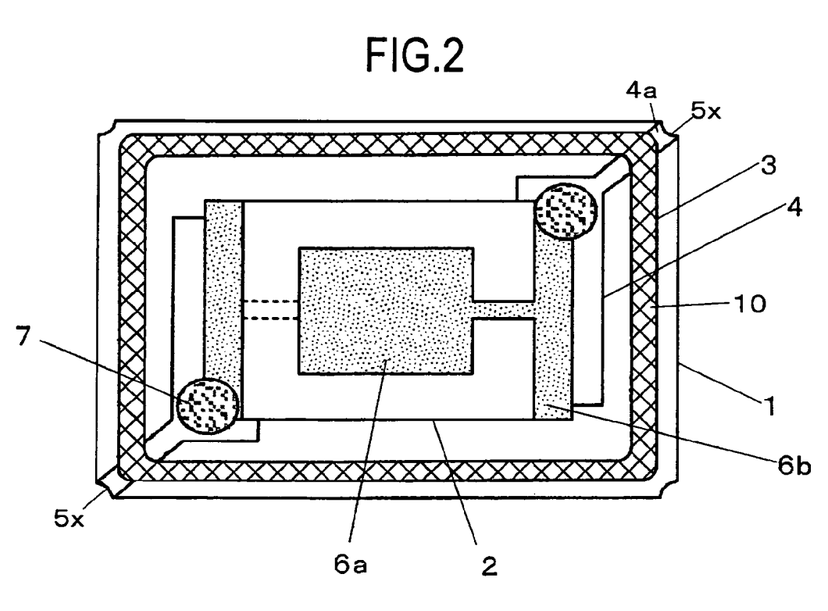
FIG. 2 is an explanatory plan view of the surface mount crystal oscillator according to the embodiment of the present invention.

[Planar Characteristics of Surface Mount Crystal Oscillator: FIG. 2]

Next, planar characteristics of the present oscillator will be described with reference to FIG. 2. FIG. 2 is an explanatory plan view of the surface mount crystal oscillator according to the embodiment of the present invention.

In the present oscillator, as shown in FIG. 2, the crystal holding terminals 4 for holding both ends of the crystal piece 2 are formed so as to face each other on the ceramic base (the substrate) 1, and each leading terminal 4*a* is formed so as to be led to the shortest corner portion of the substrate 1 from the end portion of the crystal holding terminal 4, and is connected to the through terminal 5*x*. That is, two leading terminals 4*a* are connected to the through terminals 5*x*'of the corner portions in opposite directions.

In a case where the leading terminals 4*a* are led to the corner portions of the substrate 1 and connected to the through terminals 5*x* in the corner portions, a sufficient distance can be obtained as compared with a case where the leading terminals are led outwardly in a horizontal direction or a vertical direction of the substrate 1, which avoids the short circuit between the crystal holding terminals 4 and the through terminals 5*x* via the metal cover 3, even if the metal cover 3 is displaced.

Moreover, the crystal piece 2 is connected to the crystal holding terminals 4 via the conductive adhesive 7 in the end portions of the crystal holding terminals 4 from which the leading terminals 4*a* are led.

As shown in FIG. 2, such a structure as to hold the crystal piece 2 by the crystal holding terminals 4 in both the end portions of the crystal piece 2 is referred to as a 'both-ends holding' type.

A characteristic pattern of the crystal holding terminals 4 will be described later.

Furthermore, the insulating film 10 of glass or the like is formed outwardly from the periphery of the substrate 1 which comes in contact with the opening of the metal cover. 3, and the metal cover 3 is joined onto the insulating film 10 via the seal material 8.

[Each Part of Surface Mount Crystal Oscillator]

The ceramic base (the substrate) 1 has a shape of a flat plate comprising a rectangular single plate, the crystal holding terminals 4 are formed at both ends of one main surface (the front surface) of the base, and mount terminals 5*a* and 5*b* are formed in four corner portions of the other main surface (the back surface) thereof.

Moreover, the mount terminals 5*a* and 5*b* formed in the four corner portions of the back surface thereof are connected to the through terminals 5*x* formed on the wall faces of the through holes 9.

Here, the mount terminal 5*a* is connected to the leading terminal 4*a* via the through terminal 5*x*, whereas the mount terminal 5*b* is connected to the through terminal 5*x* but is not connected to the leading terminal 4*a*.

The crystal piece 2 is AT cut, and excitation electrodes 6*a* facing each other are formed on both main surfaces of the crystal piece.

Moreover, the crystal piece 2 is provided with leading electrodes 6*b* extending from the excitation electrodes 6*a* to both end portions in mutually opposite directions to be folded back over the whole width in a width direction.

Furthermore, one set of extending diagonal portions (end portions) of the leading electrode 6*b* are secured to the crystal holding terminal 4 by the conductive adhesive 7, to electrically and mechanically connect the leading electrode 6*b* to the crystal holding terminals 4.

The metal cover 3 has a recessed shape, has an opening end face thereof bent in an L-shape, and is joined to the substrate 1 along the outer peripheral front surface of the substrate 1 by a resin as the insulating seal material 8 on the insulating film 10 made of glass or the like.

The crystal holding terminals 4 are configured to hold the crystal piece 2, and are made of a silver (Ag)-palladium (Pd) alloy. Moreover, each leading terminal 4*a* is formed along the shortest corner portion of the substrate 1 from the end portion of the crystal holding terminal 4.

The through terminals 5*x* are formed on the side walls of the through holes 9 formed in the four corners of the substrate 1, and are made of an AgPd alloy in the same manner as in the crystal holding terminals 4.

Moreover, the leading terminals 4*a* are connected to the through terminals 5*x* in the four corner portions of the substrate 1.

Additionally, since the leading terminals 4*a* are formed along the diagonal line of the substrate 1, the terminals are connected to the through terminals 5*x* in the diagonal corner portions thereof, but the through terminals 5*x* are not connected to the leading terminals 4*a* in the other diagonal corner portions.

The mount terminals 5*a* and 5*b* are formed in four corners of the back surface of the substrate 1, and connected to the through terminals 5*x* in the corner portions of the substrate 1.

As described above, the through terminals 5*x* include the through terminals connected to the leading terminals 4*a* and the through terminals which are not connected to the leading terminals, and on the back surface of the substrate 1, the mount terminals 5*a* connected to the through terminals 5*x* connected to the leading terminals 4*a* are brought into contact with each other and energized in a test by a measurement device, thereby regulating a vibration frequency as described later.

The conductive adhesive 7 electrically and mechanically connects the leading electrodes 6*b* of the crystal piece 2 to the crystal holding terminals 4.

The seal material 8 is an insulating and joining resin disposed to secure the cover 3 onto the substrate 1 so that the contact face of the cover 3 does not come in contact with the leading terminals 4*a* and the like (does not cause any short circuit).

The through holes 9 are formed simultaneously with break lines in a ceramic sheet before divided into the substrates 1, and the holes are formed in the four corner portions of the divided substrate 1 so as to extend through the front surface and back surface thereof.

The insulating film 10 is formed in a strip-like shape around the outer peripheral front surface of the substrate 1, and extends across the leading terminals 4*a* led from the crystal holding terminals 4 on the substrate 1 to cover the leading terminals.

In addition, the insulating film 10 is inwardly formed away from the outer peripheral end of the substrate 1, and does not cover the corner portions provided with the through terminals 5x.

Figure 3:
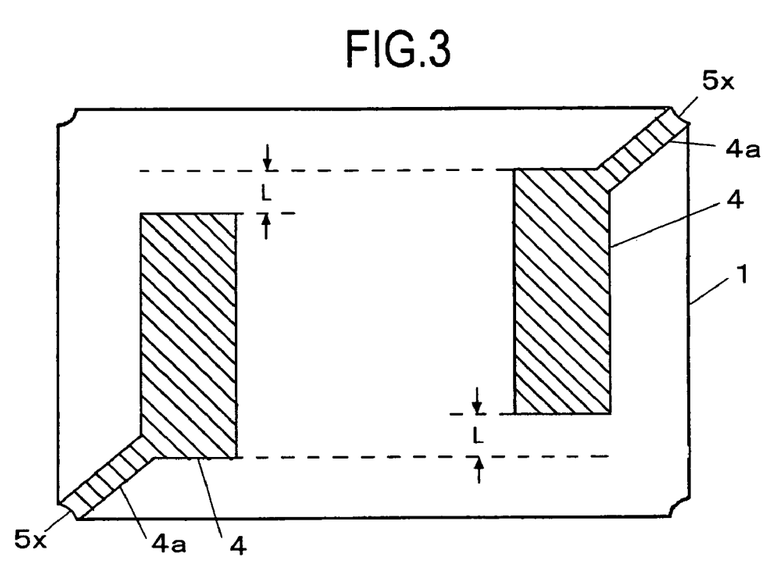
FIG. 3 is a schematic plan view for explaining a pattern of crystal holding terminals.

[Pattern of Crystal Holding Terminals: FIG. 3]

Next, specific patterns of the crystal holding terminals 4 and leading terminals 4a will be described with reference to FIG. 3. FIG. 3 is a schematic plan view for explaining the pattern of the crystal holding terminals.

In the pattern of the crystal holding terminals 4, as shown in FIG. 3, the terminals are formed so as to face each other around the center of the substrate 1, and the end portions of the terminals which are not provided with the leading terminals 4a are shorter than those of conventional crystal holding terminals as much as a length L. In consequence, even when the metal cover 3 comes in contact with one of the crystal holding terminals 4, the cover is prevented from coming in contact with the other crystal holding terminal 4, to avoid the short circuit.

Figure 4:
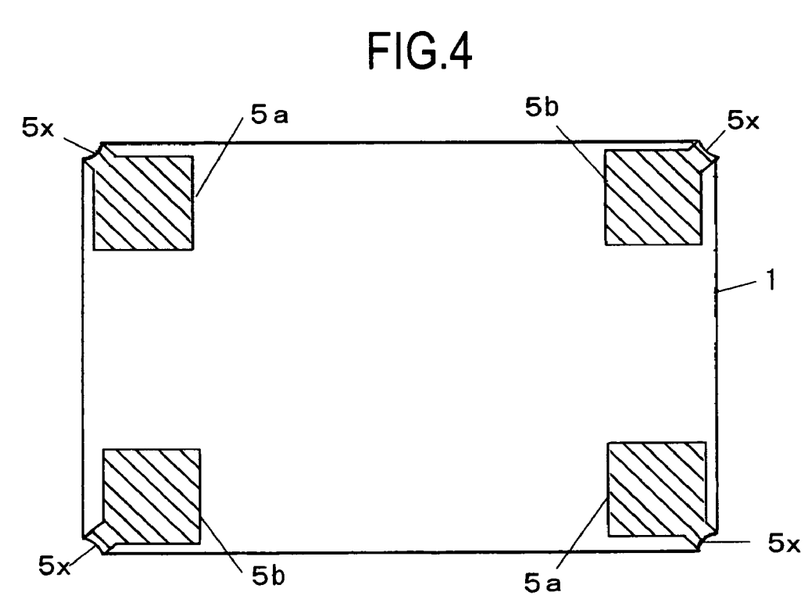
FIG. 4 is a schematic plan view for explaining a pattern of mount terminals.

[Pattern of Mount Terminal 5a on Back Surface of the Present Oscillator: FIG. 4]

Moreover, on the back surface of the substrate 1, the mount terminals 5a and 5b have a pattern shown in FIG. 4, and in the four corners of the substrate 1, rectangular metal patterns are connected to the through terminals 5x formed on the wall faces of the through holes 9.

FIG. 4 is a schematic plan view for explaining the pattern of the mount terminals.

Figure 5:
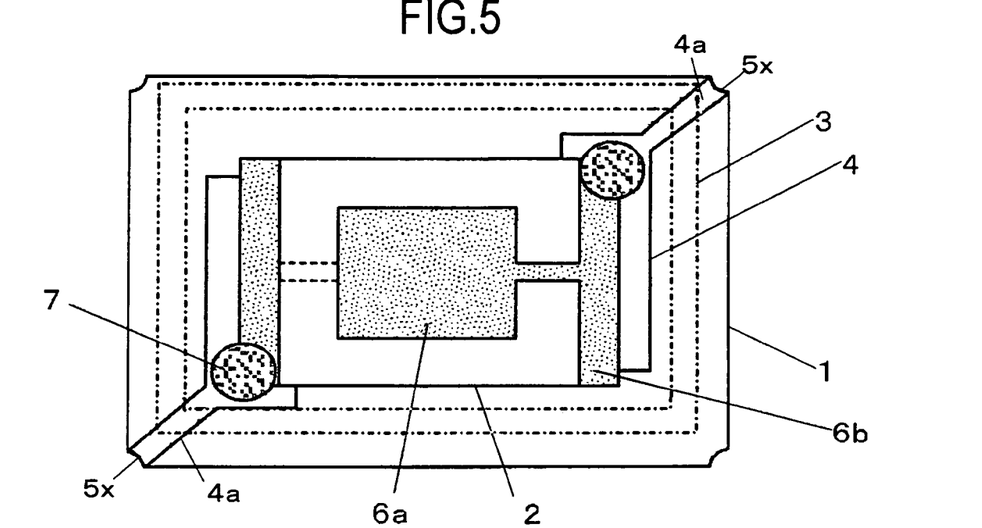
FIG. 5 is an explanatory plan view showing displacement of a metal cover.

[Displacement of Metal Cover: FIG. 5]

Next, displacement of the metal cover 3 in the present oscillator will be described with reference to FIG. 5. FIG. 5 is an explanatory plan view showing the displacement of the metal cover.

A place shown by dotted lines of FIG. 2 indicates a contact face in a case where the metal cover 3 is normally disposed, and a place shown by dotted lines of FIG. 5 indicates the contact face of the metal cover 3 in a case where the displacement occurs.

Even when the displacement of the metal cover 3 occurs, the crystal holding terminal 4 is shorter than the conventional crystal holding terminal as much as the length L, and the end portion of the crystal holding terminal 4 is short inwardly from the end portion of the leading electrode 6b in a longitudinal direction. Therefore, even when the metal cover 3 comes in contact with the other crystal holding terminal 4, the end portion of the crystal holding terminal 4 does not come in contact with the metal cover 3. In consequence, it is possible to avoid the short circuit between the one crystal holding terminal 4 and the other crystal holding terminal 4 via the metal cover 3.

Specifically, in FIG. 5, even when the lower portion of the opening end face of the metal cover 3 comes in contact with the one crystal holding terminal 4 in the horizontal direction, the metal cover 3 does not come in contact with the other crystal holding terminal 4 in the same horizontal direction, so that the short circuit can be avoided.

Figure 6:
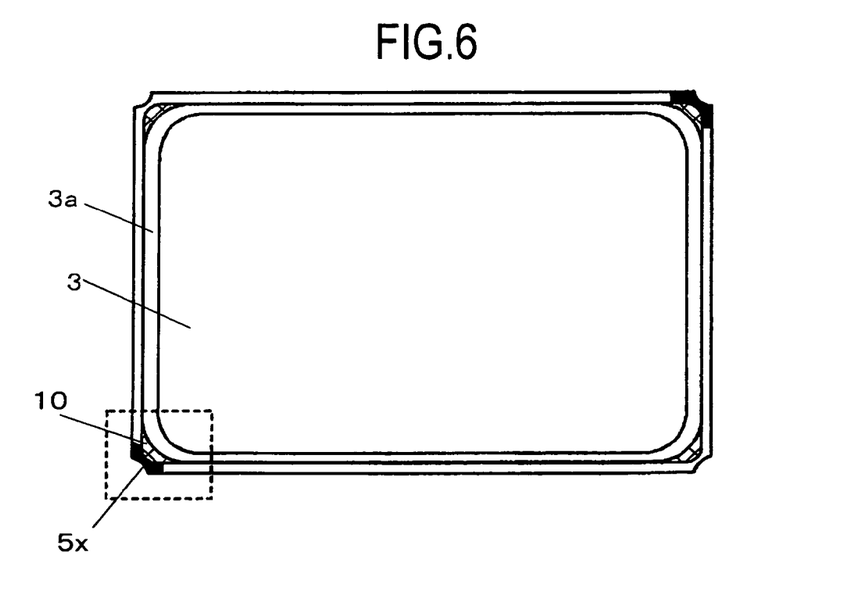
FIG. 6 is an explanatory plan view in a case where the metal cover is joined.

[Shape of Metal Cover 3: FIG. 6]

Next, the shape of the metal cover 3 will be described with reference to FIG. 6. FIG. 6 is an explanatory plan view in a case where the metal cover is joined.

As shown in FIG. 6, the metal cover 3 is joined onto the insulating film 10 of the substrate 1 via the seal material 8, to close and seal the oscillation piece 2 on the substrate 1.

Specifically, the bottom surface of a flange 3a of the metal cover 3 is bonded onto the insulating film 10 via the seal material 8, and especially in the corner portions of the substrate 1, the curvature radius of the insulating film 10 is set to be smaller than that of the flange 3a of the metal cover 3.

In consequence, in each corner portion, the corner region of the insulating film 10 is projected from the circular outer peripheral end of the flange 3a.

Figure 7:
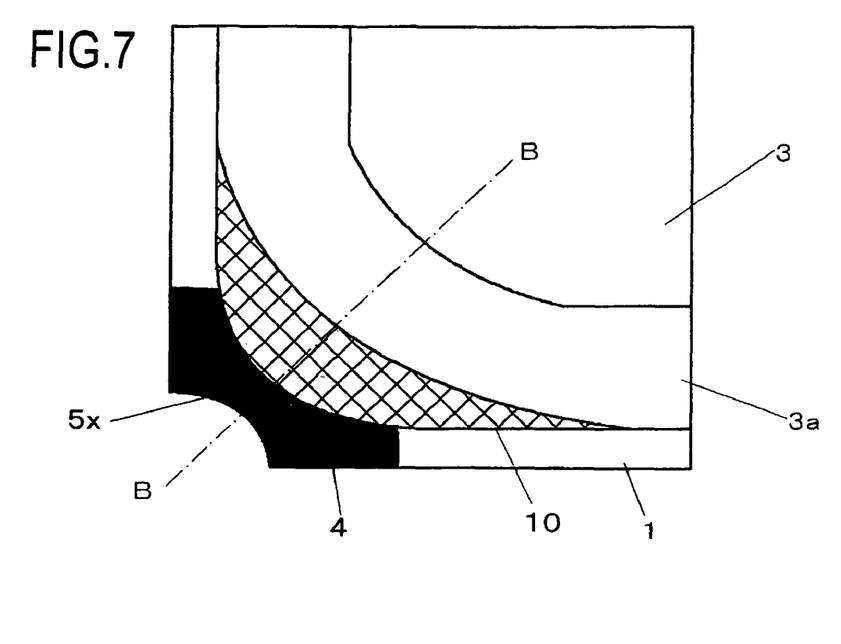
FIG. 7 is an enlarged plan view of a corner portion.
Figure 8:
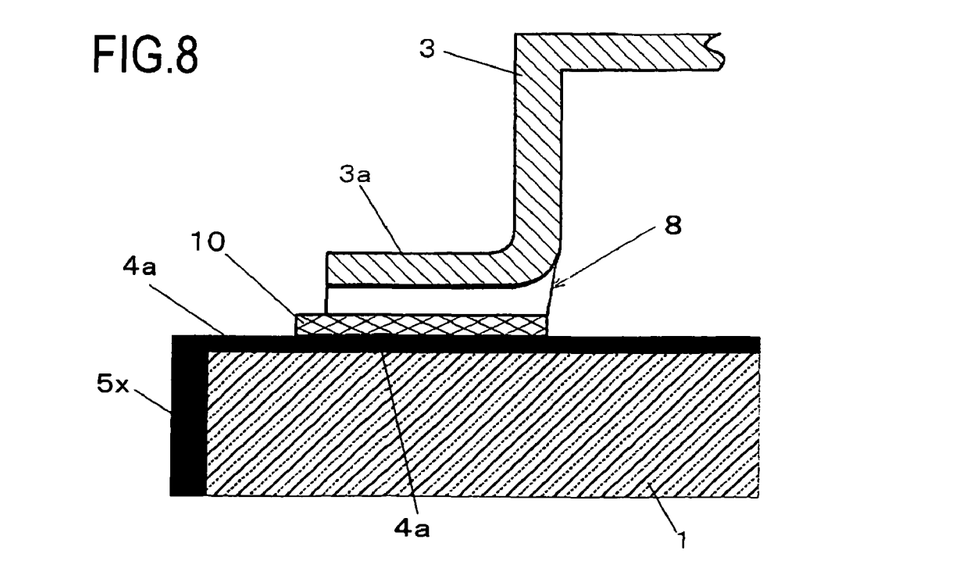
FIG. 8 is an enlarged sectional view of the corner portion.

[Details of Corner Portions: FIG. 7 and FIG. 8]

Each corner portion of the substrate 1 will further be described with reference to FIG. 7 and FIG. 8. FIG. 7 is an enlarged plan view of the corner portion, and FIG. 8 is an enlarged sectional view of the corner portion. FIG. 7 is an enlarged explanatory view of a portion surrounded with a dotted line of FIG. 6, and FIG. 8 is an explanatory sectional view cut along the B-B line of FIG. 7.

As shown in FIG. 7 and FIG. 8, the leading terminal 4a from the crystal holding terminal 4 is connected to the through terminal 5x in the corner portion of the substrate 1, the insulating film 10 is formed so as to extend along the outer peripheral front surface of the substrate 1 except a through terminal 5x side of the leading terminal 4a, and further in the corner portion, the flange 3a of the metal cover 3 is secured and joined onto the insulating film 10 via the seal material 8 while a part of the insulating film 10 is exposed in a corner direction.

Here, in each corner portion of the substrate 1, the curvature radius of the insulating film 10 is set to be smaller than that of the flange 3a of the metal cover 3, so that the insulating film 10 is projected from the curve of the flange 3a toward the through terminal 5x.

In consequence, even if the flange 3a of the metal cover 3 is displaced in a through terminal 5x direction, the flange 3a is still disposed on the insulating film 10, which avoids short circuit due to contact between the metal cover 3 and the leading terminal 4a connected to the through terminal 5x.

Figure 9:
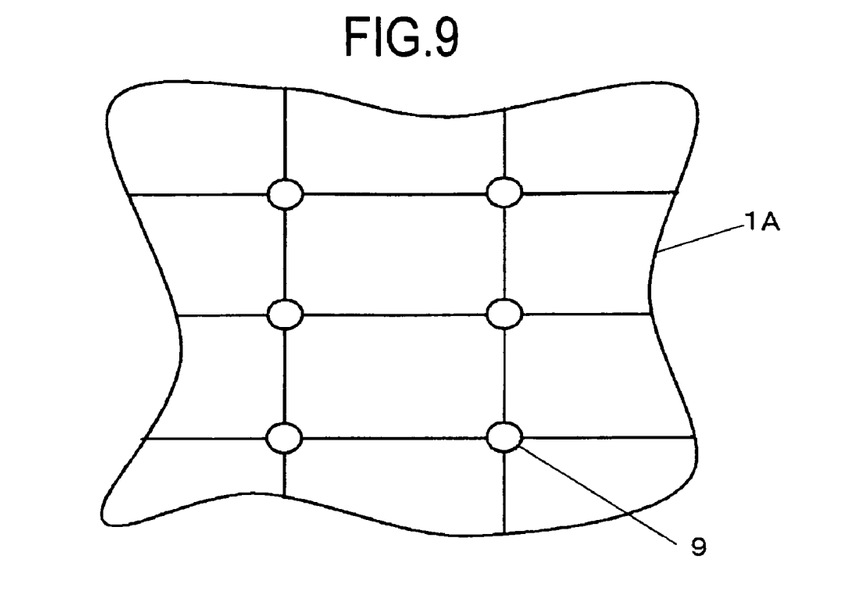
FIG. 9 is a diagram showing that through holes and break lines are formed in a sheet-like ceramic plate.
Figure 10:
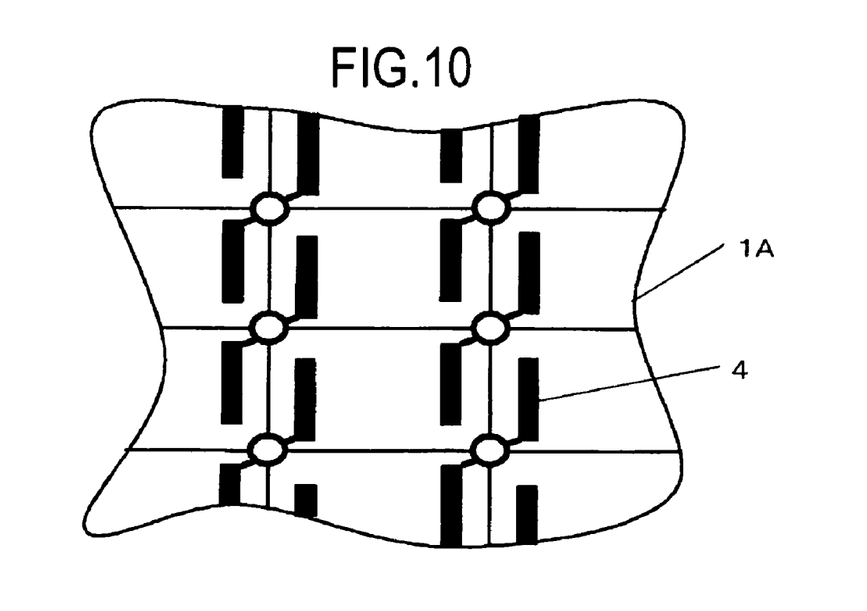
FIG. 10 is a diagram showing that the pattern of the crystal holding terminals is formed on the sheet-like ceramic plate.
Figure 11:
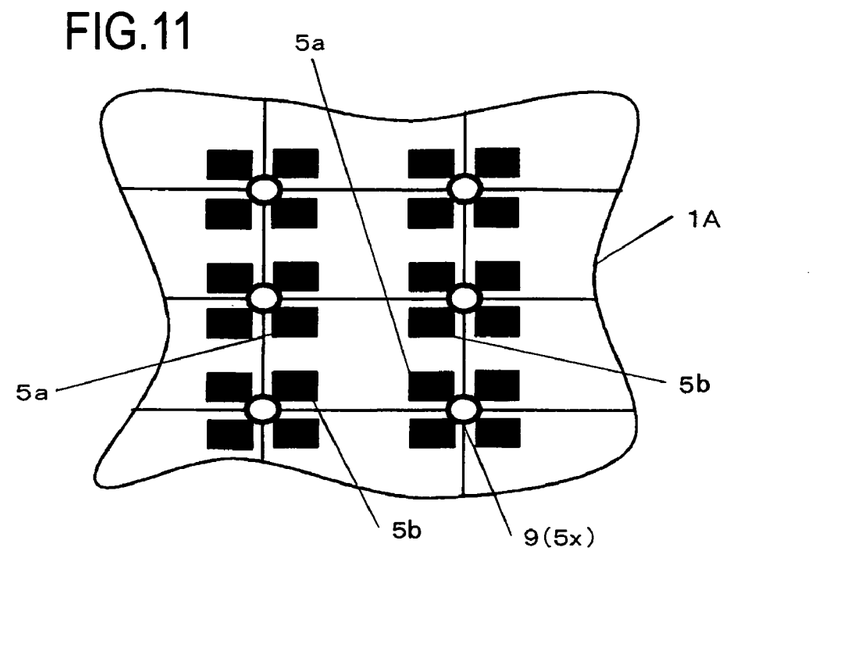
FIG. 11 is a diagram showing that the pattern of the mount terminals is formed on the sheet-like ceramic plate.

[Manufacturing Method of the Present Oscillator: FIGS. 9 to 11]

Next, a manufacturing method of the present oscillator will be described with reference to FIGS. 9 to 11. FIG. 9 is a diagram showing that through holes and break lines are formed in a sheet-like ceramic plate, FIG. 10 is a diagram showing that the pattern of the crystal holding terminals is formed on the sheet-like ceramic plate, and FIG. 11 is a diagram showing that the pattern of the mount terminals is formed on the sheet-like ceramic plate.

[First Step: FIG. 9/Sheet-Like Ceramic Material Firing]

First, a sheet-like ceramic material is formed as the material of a sheet-like ceramic base 1A.

In the sheet-like ceramic material, as shown in FIG. 9, break lines for separating adjoining regions corresponding to the individual ceramic bases 1 from one another are formed, and the through holes 9 are also formed in four corner portions of each base.

Subsequently, the sheet-like ceramic material provided with the through holes 9 is fired, thereby obtaining the sheet-like ceramic base 1A.

[Second Step A: FIG. 10 and FIG. 11/Circuit Pattern Formation]

Next, the regions corresponding to circuit patterns of the sheet-like ceramic base 1A are provided with a metal paste of the AgPd alloy having a thickness of about 10 μm by printing using masks.

As to each circuit pattern, as shown in FIG. 10, the pattern of the crystal holding terminals 4 is formed on one main surface (the front surface), and as shown in FIG. 11, the pattern of the mount terminals 5a and 5b is formed on the other main surface (the back surface). Furthermore, the through terminals 5x are formed on the wall faces of the through holes 9.

The crystal holding terminals 4 on the one main surface (the front surface) are point-symmetric around the center of each ceramic base 1 as described above. That is, the leading terminals 4a are formed along the diagonal line of the ceramic base 1.

Moreover, one set of diagonally formed mount terminals 5a on the other main surface (the back surface) are external crystal terminals electrically connected to the crystal holding terminals 4 through the through terminals 5x and the leading terminals 4a, and the other set of diagonally formed mount terminals 5b are dummy terminals.

Subsequently, the metal paste of the AgPd alloy is fired at about 850° C., to evaporate a binder from the metal paste and melt and solidify the AgPd alloy, thereby obtaining the sheet-like ceramic base 1A provided with the circuit patterns.

It is to be noted that a ceramic firing temperature is from about 1500 to 1600° C. and the firing temperature of the AgPd alloy is a lower temperature of 850° C., whereby after firing the ceramic material, the AgPd alloy paste is applied, and fired together with the ceramic material.

This is because if the AgPd alloy paste is applied to the ceramic material and fired at the ceramic firing temperature, the AgPd alloy paste is agglomerated in the form of grains owing to the excessively high temperature and any circuit pattern cannot be formed.

Figure 12:
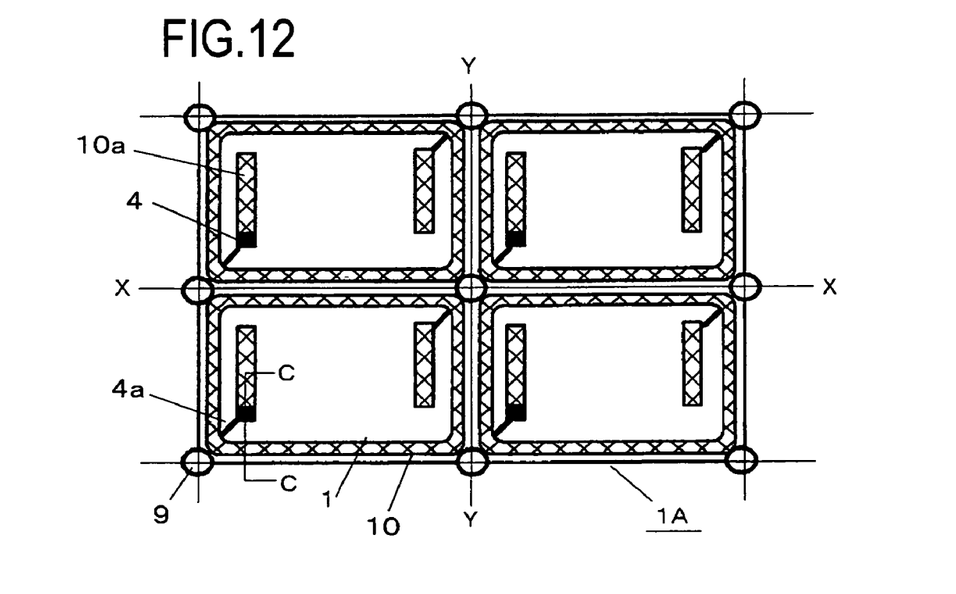
FIG. 12 is an explanatory plan view of formation of an insulating film.
Figure 13:
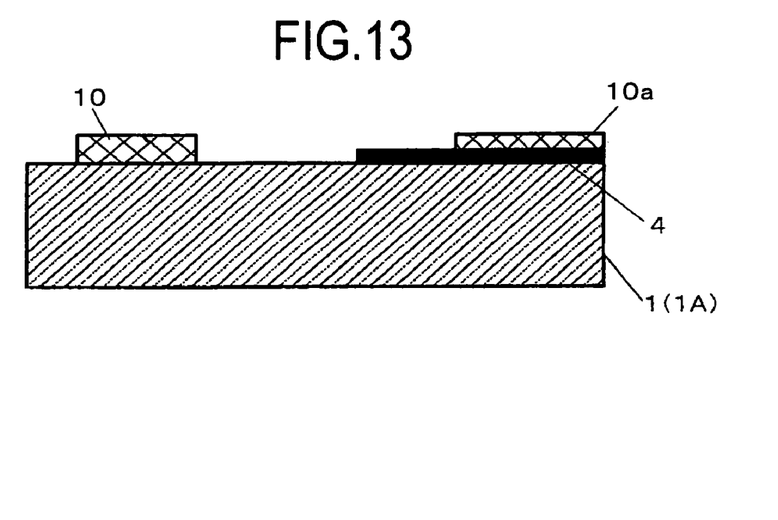
FIG. 13 is an explanatory sectional view of the formation of the insulating film.

[Second Step B: FIG. 12 and FIG. 13/Formation of Insulating Film 10]

Next, the formation of the insulating film 10 will be described with reference to FIG. 12 and FIG. 13. FIG. 12 is an explanatory plan view of the formation of the insulating film, and FIG. 13 is an explanatory sectional view of the formation of the insulating film. FIG. 13 corresponds to a sectional view cut along the C-C line of FIG. 12.

A glass paste is applied to the outer peripheral front surface of each rectangular region (corresponding to the substrate 1) of the sheet-like ceramic base 1A provided with the circuit patterns, thereby forming the insulating film 10 by printing.

Subsequently, the base is fired at a temperature equal to or lower than the firing temperature (about 850° C.) of the AgPd alloy, to solidify the glass. Here, during the printing of the glass paste, the glass paste is simultaneously applied to the surface of one layer of each of the crystal holding terminals 4 to form a second layer of an insulating film 10a by printing.

Figure 14:
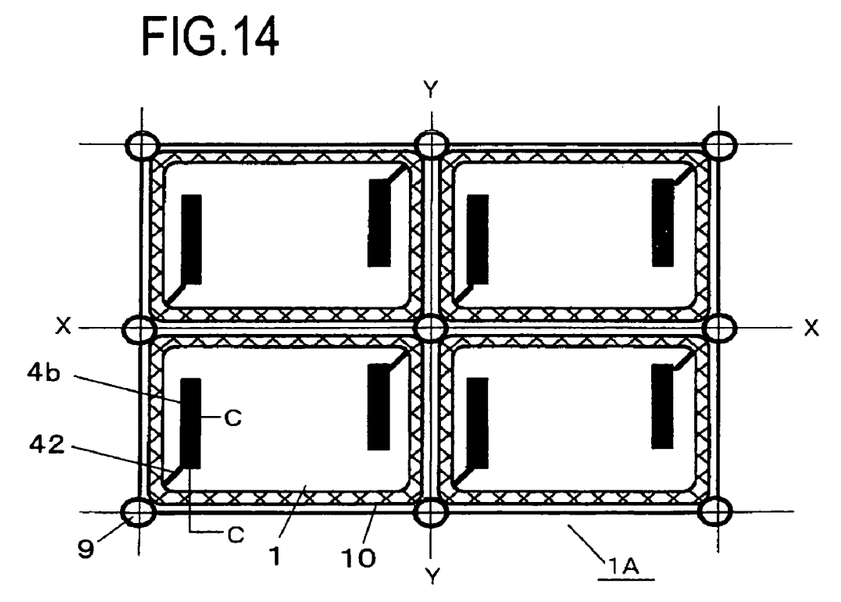
FIG. 14 is an explanatory plan view of applying of a metal paste onto a metal film.
Figure 15:
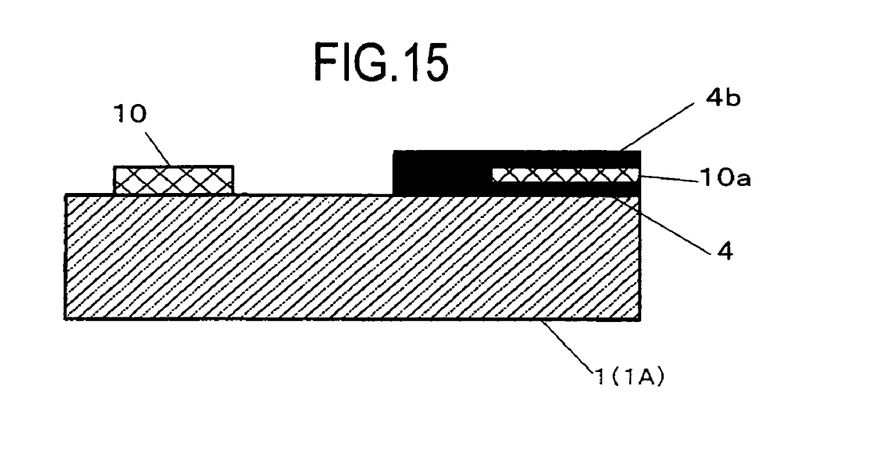
FIG. 15 is an explanatory sectional view of the applying of the metal paste onto the metal film.

[Second Step C: FIG. 14 and FIG. 15/Applying of Metal Paste onto Insulating Film 10a]

Next, the applying of the metal paste on the insulating film 10a will be described with reference to FIG. 14 and FIG. 15. FIG. 14 is an explanatory plan view of applying of a metal paste onto a metal film, and FIG. 15 is an explanatory sectional view of the applying of the metal paste onto the metal film. FIG. 15 corresponds to a sectional view cut along the C-C line of FIG. 14.

A metal paste (the AgPd alloy) for a third layer is again applied onto the second layer of the insulating film 10a of each of the crystal holding terminals 4 by printing, and fired. In consequence, the first layer and the third layer of the crystal holding terminal 4 are made of the AgPd alloy, and the second layer is made of glass (the insulating film 10a).

In this way, the crystal holding terminals 4 have a three-layer structure, so that the crystal piece 2 can be held at a high position with respect to the leading terminals 4a.

[Third Step/Crystal Piece Mounting]

Next, the outer peripheral portion of the crystal piece 2 including the leading electrodes 6b extended from the excitation electrodes 6a is secured and mounted onto each crystal holding terminal 4 of the sheet-like ceramic base 1A provided with the circuit patterns by the conductive adhesive 7, to electrically and mechanically connect the crystal piece to the terminals.

Here, one set of diagonal portions of the crystal piece 2 including the extended leading electrodes 6b are secured.

[Fourth Step/Frequency Regulation]

Next, the vibration frequency of each crystal piece 2 as a crystal oscillator mounted (secured) onto the sheet-like ceramic base 1A is regulated in accordance with a mass load effect.

Specifically, on the back surface of the sheet-like ceramic base 1A, a measurement terminal (a probe) from a measurement unit is brought into contact with the mount terminal 5a electrically connected to each crystal piece 2. Subsequently, the excitation electrode 6a on the front surface of the crystal piece 2 on which a plate face is exposed is irradiated with gas ions to cut the front surface from the electrode, and the mass of the excitation electrode 6a is decreased to regulate the vibration frequency from a low frequency to a high frequency.

Alternatively, for example, a metal film is applied onto the excitation electrode 6a by evaporation or sputtering, whereby the vibration frequency may be regulated from a high frequency to a low frequency.

[Fifth Step/Metal Cover Joining (Closing and Sealing)]

Next, the opening end face of the metal cover 3 (a flange lower surface) having the recessed shape is joined, via the seal material 8, onto the insulating film 10 in the front surface of the outer periphery of the rectangular region corresponding to each ceramic base 1 of the sheet-like ceramic base 1A on which the crystal piece 2 is mounted.

Here, a resin beforehand applied or transferred to the opening end face of the metal cover 3 is used as the seal material 8, which is heated to melt, thereby joining the metal cover. For example, the opening end face of the metal cover 3 is formed in an L-shape, to lengthen a so-called seal path. In consequence, the individual crystal pieces 2 are closed and sealed, to form collected sheet-like crystal oscillators.

[Sixth Step/Dividing]

Finally, the sheet-like ceramic base 1A including the crystal oscillators collected therein is longitudinally and transversely divided along the break lines to obtain individual surface mount crystal oscillators.

In the manufacturing method of the present embodiment, the circuit pattern (the crystal holding terminals 4, the through terminals 5x and the mount terminals 5a) of the ceramic base 1 is made of the AgPd alloy. After firing the sheet-like ceramic material provided with the through holes 9, the AgPd alloy paste is applied and fired to form the circuit pattern.

Therefore, as compared with a conventional example in which a tungsten (W) paste is applied to the sheet-like ceramic material and fired to form nickel (Ni) and gold (Au) by electrolytic plating, two electrolytic plating steps are not necessary, whereby the number of manufacturing steps can be decreased.

Moreover, since the electrolytic plating steps are not necessary, for example, electrolytic plating wiring lines for electrically connecting the circuit patterns of the ceramic bases 1 to each other are also not necessary, which produces an effect that the circuit patterns can be simplified and made inexpensive.

Moreover, here, in the state of the sheet-like ceramic base 1A provided with the circuit patterns, the crystal pieces 2 are mounted (the third step), the frequency is regulated (the fourth step) and the metal covers 3 are joined (the fifth step).

Therefore, in the state of the sheet-like ceramic base 1A, these steps can continuously be performed, which produces an effect that productivity can be improved.

Furthermore, in the present embodiment, the mount terminals 5a and 5b on the back surface of the ceramic base 1 are four electrically independent terminals. On the other hand, in the state of the sheet-like ceramic base 1A, the mount terminals 5a and 5b (four terminals) in four corner portions of adjoining rectangular regions are electrically connected in common through the through terminals 5x.

Therefore, also in a state where the mount terminals 5a and 5b in the four corner portions are connected in common, an effect is produced that the measurement terminal can be brought into contact with one set of mount terminals 5a of the diagonal portions connected to the crystal holding terminals 4 of each ceramic base 1 to regulate the vibration frequency of each crystal piece 2.

Moreover, according to the present oscillator and the manufacturing method of the oscillator, the leading terminal 4a in each corner portion is a circular electrode to be connected to the through terminal 5x in FIG. 7, and the insulating film 10a extends across a part of the electrode to cover the part. Therefore, it is possible to prevent short circuit between the metal cover 3 and the leading terminals 4a in a case where the cover is sealed with the seal material 8.

Furthermore, a region of the corner portion across which the insulating film 10 is formed extends outwardly from the outer peripheral end of the flange lower surface of the metal cover 3, whereby when the surface mount crystal oscillator is connected to a set substrate by, for example, reflow of a lead-free solder, it is possible to prevent short circuit between the solder which climbs the through terminals 5x and the metal cover 3.

In this case, in each corner portion, the curvature radius of the insulating film 10a is set to be smaller than that of the flange 3a of the metal cover 3 (i.e., curvature is increased), whereby the insulating film 10 is formed along the whole periphery of the outer peripheral front surface of the substrate 1 which faces the opening end face of the metal cover 3.

Therefore, the pattern of the insulating film 10 can be simplified and extended outwardly from the outer peripheral end of the flange 3a. Moreover, the seal material 8 applied or transferred to the opening end face of the metal cover 3 (the lower surface of the flange 3a) is flatly and evenly interposed between the opening end face of the metal cover 3 and the outer peripheral front surface of the substrate 1 which faces the opening end face of the metal cover, without any stepped portion, whereby airtight sealing can satisfactorily be kept.

Furthermore, since the crystal holding terminals 4 include three layers, the crystal holding terminals become thicker than the leading terminals 4a, whereby the crystal piece 2 can be held at a position higher than the leading terminals 4a. In addition, the second layer between the first layer and the third layer of each crystal holding terminal 4 is formed as the insulating film 10a of glass, which can save a material cost.

In this case, the insulating, film 10a is formed by using the same mask simultaneously with the printing of the insulating film 10 on the outer peripheral front surface of the substrate 1. Therefore, as compared with a case where the second layer of the crystal holding terminal 4 is formed by printing using a conductive material (the AgPd alloy or the like) and another mask, the number of printing steps can be decreased to improve productivity.

Moreover, the insulating film 10 of the outer peripheral front surface of each substrate 1 is formed by similar printing in the printing step of forming the circuit pattern in the rectangular region corresponding to each substrate 1 by printing using a mask in, for example, a fired ceramic sheet, which improves the productivity as compared with a case where the opening end faces of the metal covers 3 are individually provided with insulating films.

In the present oscillator, the metal cover 3 includes a flange, but the present embodiment can similarly be applied to, for example, a case where miniaturization advances, the metal cover does not include any flange, and the opening end face thereof has a thickness only of the metal cover 3.

Moreover, the leading terminal 4a from the crystal holding terminal 4 is extended to the corner portion, but leading terminals may be extended to centers of both ends. Moreover, the leading terminals may be connected to mount terminals at both the ends of an outer bottom surface (the back surface) through end face electrodes. In this case, two terminals are disposed as the mount terminals of the back surface.

Furthermore, the leading electrodes are extended to both end portions, of the crystal piece 2, but the present embodiment can be applied to a case where the leading electrodes are extended to both sides of one end portion of the crystal piece and secured thereto.

The insulating film 10a is formed along the whole periphery, but may intermittently be formed, or a part of the insulating film may be cut, as long as the insulating film is extended outwardly from the flange 3a of the metal cover 3 so as to cover the leading terminal 4a.

Moreover, the curvature of the insulating film 10 is set to be smaller than that of each corner portion of the metal cover 3 (the flange 3a), to project the insulating film 10 from the outer peripheral end of the flange 3a. However, the insulating film 10 may be projected while the film has a curvature equal to that of the corner portion, that is, the outer peripheral end of the flange 3a may be disposed inwardly from the outer peripheral end of the insulating film 10a.

The insulating film 10a is made of glass, but, for example, a resin having a heat resistance higher than the resin of the seal material 8 may be applied.

Moreover, the circuit pattern is made of the AgPd alloy, but an Ag-based thick-film material such as an AgPd alloy mainly composed of Ag having a comparatively satisfactory adhering force with respect to a ceramic material may be applied.

Figure 16:
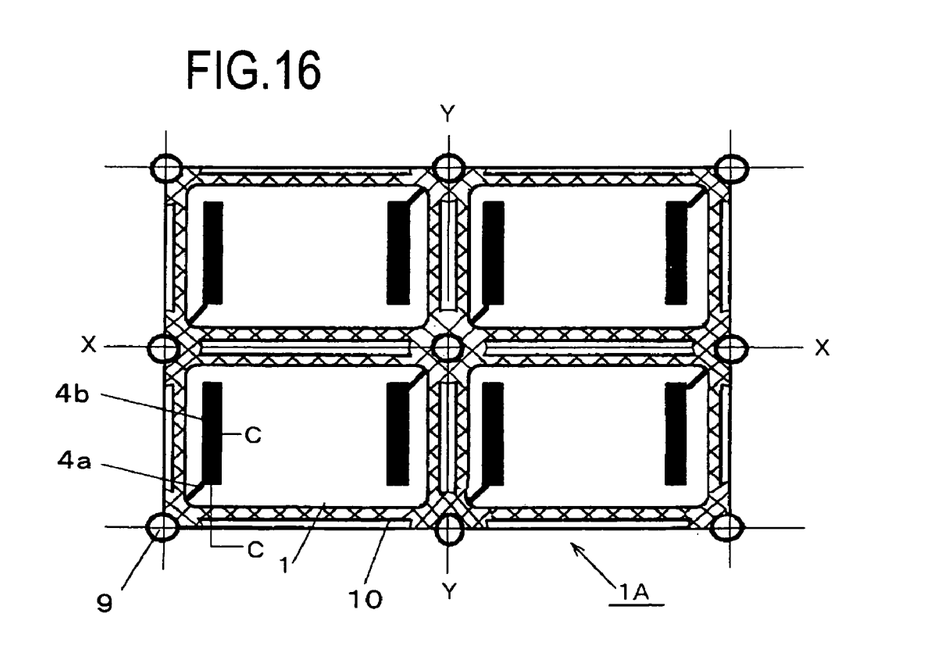
FIG. 16 is an explanatory plan view showing pattern formation of another insulating film.
Figure 17:
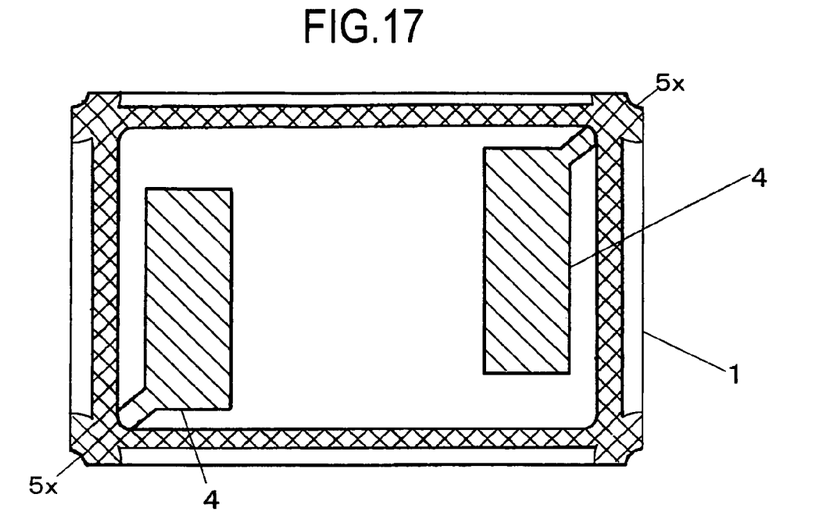
FIG. 17 is an explanatory plan view showing pattern formation of the other insulating film for each substrate.

[Another Insulating Film Patten: FIG. 16 and FIG. 17]

Next, another pattern of an insulating film 10 in the present oscillator will be described with reference to FIG. 16 and FIG. 17. FIG. 16 is an explanatory plan view showing pattern formation of another insulating film, and FIG. 17 is an explanatory plan view showing pattern formation of the other insulating film for each substrate.

As shown in FIG. 16 and FIG. 17, the pattern of the insulating film 10 of glass is also formed on a circular electrode of a leading terminal 4a of each corner portion. This can effectively prevent short circuit between a metal cover 3 and the leading terminals 4a.

Furthermore, when the insulating film 10 is simultaneously formed along the whole outer periphery (an outer wall) of each through terminal 5x, short circuit between a solder climbing the through terminals 5x and the metal cover 3 can effectively be prevented.

It is to be noted that the pattern of the insulating film 10 is also formed with respect to a through hole 9 which is not provided with the leading terminal.

Figure 18:
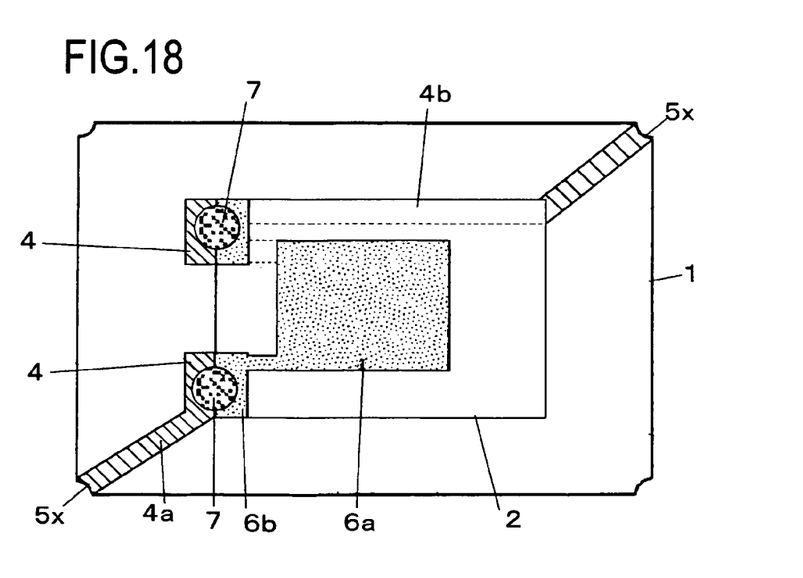
FIG. 18 is an explanatory plan view of a surface mount crystal oscillator according to another embodiment.

[Cantilever Type: FIG. 18]

Next, a surface mount crystal oscillator according to another embodiment will be described with reference to FIG. 18. FIG. 18 is an explanatory plan view of the surface mount crystal oscillator according to the other, embodiment.

In the surface mount crystal oscillator according to the other embodiment (the other oscillator), as shown in FIG. 18, a leading electrode 6b is formed in one end portion of a crystal piece 2, and the one end portion is connected to a crystal holding terminal 4 via a conductive adhesive 7. In the one crystal holding terminal 4, a leading terminal 4a is formed in the shortest corner portion, and in another crystal holding terminal 4, a leading terminal 4b is led under the crystal piece 2 in a horizontal direction of FIG. 18, and formed to be connected to the shortest corner portion from the corner portion of the crystal piece 2.

A constitution of FIG. 18 is referred to as a 'cantilever' type, because one side of the crystal piece 2 is held.

Also in the cantilever type of FIG. 18, the crystal piece is connected to mount terminals 5a on the back surface via through terminals 5x formed in through holes 9 along a diagonal line in the same manner as in the both-ends holding type of the present oscillator, and the back surface has a pattern of mount terminals 5a and 5b shown in FIG. 11.

It is to be noted that a manufacturing method of the other oscillator in FIG. 18 is similar to the manufacturing method of the present oscillator, which produces an effect that productivity can be improved.

Moreover, a measurement terminal is brought into contact with the mount terminal 5a on the back surface, whereby frequency regulation of each crystal piece 2 can similarly be performed.

Furthermore, it is possible to effectively prevent the short circuit between the metal cover 3 and the leading terminal 4a and it is also possible to effectively prevent the short circuit between the metal cover 3 and the solder climbing the through terminal 5x.

[Effect of the Embodiments]

According to the present oscillator and the other oscillator, the ceramic base 1 is a single plate, and hence a manufacturing unit price can basically be lowered. The electrodes including the crystal holding terminals 4 are made of the AgPd alloy. Therefore, as compared with a conventional case where W, Ni and Au are used, an effect is produced that a material cost of the electrodes or the number of steps can be decreased to further make the oscillator inexpensive.

Furthermore, according to the present oscillator and the other oscillator, the leading terminals 4a from the crystal holding terminals 4 are led to the corner portions of the ceramic base 1 along the diagonal line thereof, and connected to the mount terminals 5a on the back surface via the through terminals 5x formed on the wall faces of the through holes 9 formed in the corner portions. Therefore, as compared with a case where the leading terminals 4a are led in the horizontal direction or the vertical direction, the leading terminals can be lengthened. Even if the opening end face portion of the metal cover 3 comes in contact with one end of the one crystal holding terminal 4, the cover portion is distant from the through terminal 5x, which produces an effect that the cover can be prevented from being brought into contact with the through terminal 5x to avoid short circuit (short).

Moreover, in the present oscillator, the end portion of the crystal holding terminal 4 is shorter than the leading electrode 6b of the crystal piece. Therefore, if the opening end face portion as one side of the metal cover 3 comes in contact with the one crystal holding terminal 4, the cover can be prevented from coming in contact with the other crystal holding terminal 4 in the same direction.

In consequence, an effect is produced that a pair of crystal holding terminals 4 can be prevented from electrically causing the short circuit via the metal cover 3, and productivity can be improved.

Furthermore, in the other oscillator, the leading terminal 4b is passed under the crystal piece 2 and connected to the leading electrode 6b, which produces an effect that a pair of crystal holding terminals 4 can be prevented from causing the short circuit via the metal cover 3 with respect to the vertical direction of FIG. 11.

However, the crystal holding terminals 4 are arranged side by side in the vertical direction of FIG. 11, and hence attention needs to be paid to displacement in a transverse direction of FIG. 11.

Moreover, according to the present oscillator and the other oscillator, resistance to the displacement of the metal cover 3 is imparted, which produces an effect that the variance of the secured state of the conductive adhesive 7 is suppressed and stabilized, and aging characteristics of the surface mount crystal oscillator can satisfactorily be kept.

Furthermore, according to the present oscillator and the other oscillator, the pattern of the insulating film 10 is formed so that the opening end face of the metal cover 3 does not come in contact with the leading terminal 4a in each corner portion. In addition, the insulating film 10 is formed so that the solder which probably climbs the through terminal 5x does not come in contact with the metal cover 3, which produces an effect that the short circuit can be prevented and a highly reliable product can be provided.

The present invention is suitable for a surface mount crystal oscillator which can enhance a product quality and improve productivity while realizing miniaturization and a manufacturing method of the oscillator.

What is claimed is:

1. A surface mount crystal oscillator comprising a crystal piece held by first and second crystal holding terminals on a rectangular ceramic substrate,
   wherein a metal cover is disposed to close and seal the crystal piece on the substrate,
   on wall faces of through holes formed in corner portions of the substrate, through terminals are formed,
   on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, on the back surface of the substrate, mount terminals connected to the through terminals are formed,
   on the outer peripheral front surface of the substrate, an insulating film is formed at such a position as to face the opening end face of the metal cover,
   a curvature radius of the insulating film is set to be smaller than the opening end face of the metal cover in the corner portions of the substrate, and
   a corner region of the insulating film is projected from a circular outer peripheral end of the opening end face of the metal cover in the corner portions of the substrate.

2. The surface mount crystal oscillator according to claim 1, wherein the insulating film is formed so as to cover the first leading terminal and the second leading terminal and also cover the outside of the through terminals in the corner portions of the substrate.

3. The surface mount crystal oscillator according to claim 1, wherein one leading electrode of the crystal piece and the other leading electrode of the crystal piece are led in opposite directions, and
   the first crystal holding terminal and the second crystal holding terminal constitute such a both-ends holding type as to hold both ends of the crystal piece.

4. The surface mount crystal oscillator according to claim 2, wherein one leading electrode of the crystal piece and the other leading electrode of the crystal piece are led in opposite directions, and
the first crystal holding terminal and the second crystal holding terminal constitute such a both-ends holding type as to hold both ends of the crystal piece.

5. The surface mount crystal oscillator according to claim 3, wherein the first crystal holding terminal is connected to the one leading electrode of the crystal piece by a conductive adhesive in an end portion from which the first leading terminal is led, and
the second crystal holding terminal is connected to the other leading electrode of the crystal piece by the conductive adhesive in an end portion from which the second leading terminal is led.

6. The surface mount crystal oscillator according to claim 4, wherein the first crystal holding terminal is connected to the one leading electrode of the crystal piece by a conductive adhesive in an end portion from which the first leading terminal is led, and
the second crystal holding terminal is connected to the other leading electrode of the crystal piece by the conductive adhesive in an end portion from which the second leading terminal is led.

7. The surface mount crystal oscillator according to claim 5, wherein the end portion of the first crystal holding terminal on a side on which any conductive adhesive is not disposed is formed to be short inwardly from the end portion of the one leading electrode, and
the end portion of the second crystal holding terminal on a side on which any conductive adhesive is not disposed is formed to be short inwardly from the end portion of the other leading electrode.

8. The surface mount crystal oscillator according to claim 6, wherein the end portion of the first crystal holding terminal on a side on which any conductive adhesive is not disposed is formed to be short inwardly from the end portion of the one leading electrode, and
the end portion of the second crystal holding terminal on a side on which any conductive adhesive is not disposed is formed to be short inwardly from the end portion of the other leading electrode.

9. The surface mount crystal oscillator according to claim 1, wherein one leading electrode and the other leading electrode of the crystal piece are led in the same direction, and
the first crystal holding terminal and the second crystal holding terminal constitute such a cantilever type as to hold one end of the crystal piece.

10. The surface mount crystal oscillator according to claim 2, wherein the one leading electrode and the other leading electrode of the crystal piece are led in the same direction, and
the first crystal holding terminal and the second crystal holding terminal constitute such a cantilever type as to hold one end of the crystal piece.

11. The surface mount crystal oscillator according to claim 9, wherein the first crystal holding terminal is connected to the one leading electrode led to one side of the crystal piece by a conductive adhesive in an end portion from which the first leading terminal is led, and
the second crystal holding terminal is connected to the other leading electrode led to the one side of the crystal piece by a conductive adhesive in the one side of the crystal piece from which the other leading electrode is led, and the second leading terminal passes under the crystal piece from a position of the second crystal holding terminal connected by the conductive adhesive and is connected to the through terminal of the corner portion in the direction reverse to the direction in which the first leading terminal is led.

12. The surface mount crystal oscillator according to claim 10, wherein the first crystal holding terminal is connected to the one leading electrode led to one side of the crystal piece by a conductive adhesive in an end portion from which the first leading terminal is led, and
the second crystal holding terminal is connected to the other leading electrode led to the one side of the crystal piece by a conductive adhesive in the one side of the crystal piece from which the other leading electrode is led, and the second leading terminal passes under the crystal piece from a position of the second crystal holding terminal connected by the conductive adhesive and is connected to the through terminal of the corner portion in the direction reverse to the direction in which the first leading terminal is led.

13. A manufacturing method of a surface mount crystal oscillator comprising a crystal piece held by first and second crystal holding terminals on a rectangular ceramic substrate, comprising:
a step of forming, in a sheet-like ceramic material, break lines which specify individual ceramic substrate regions and through holes which correspond to corner portions of the regions and firing the ceramic material to form a sheet-like ceramic base;
a step of forming metal layers of through terminals on wall faces of the through holes, forming, on the front surface of the ceramic base, a pattern of a metal layer in which the first crystal holding terminal and a first leading terminal led from the terminal are connected to the through terminal of the shortest corner portion, and a second leading terminal led from the second crystal holding terminal is connected to the through terminal of the corner portion in a direction reverse to a direction in which the first leading terminal is led, and forming, on the back surface of the ceramic base, a pattern of a metal layer of mount terminals connected to the through terminals;
a step of forming an insulating film at such a position as to face the opening end face of a cover on the outer peripheral front surface of the substrate so that the insulating film projects from the opening end face in the corner portions of the substrate;
a step of mounting the crystal piece on the first and second crystal holding terminals; and
a step of regulating a vibration frequency by use of the mount terminal connected to the first crystal holding terminal and the mount terminal connected to the second crystal holding terminal.

14. The manufacturing method of the surface mount crystal oscillator according to claim 13, wherein the step of forming the insulating film forms the insulating film so as to cover the first leading terminal and the second leading terminal and also cover the outside of the through terminals in the corner portions of the substrate.

15. The manufacturing method of the surface mount crystal oscillator according to claim 13, wherein an excitation electrode on the front surface of the crystal piece is irradiated with gas ions to cut the front surface from the excitation electrode, and a mass of the excitation electrode is decreased to regulate the vibration frequency from a low frequency to a high frequency.

16. The manufacturing method of the surface mount crystal oscillator according to claim 14, wherein an excitation electrode on the front surface of the crystal piece is irradiated with gas ions to cut the front surface from the excitation electrode, and a mass of the excitation electrode is decreased to regulate the vibration frequency from a low frequency to a high frequency.

17. The manufacturing method of the surface mount crystal oscillator according to claim 13, wherein a metal film is applied onto the excitation electrode to regulate the vibration frequency from a high frequency to a low frequency.

18. The manufacturing method of the surface mount crystal oscillator according to claim 14, wherein a metal film is applied onto the excitation electrode to regulate the vibration frequency from a high frequency to a low frequency.

* * * * *